US012598768B2

(12) United States Patent
Dinh et al.

(10) Patent No.: US 12,598,768 B2
(45) Date of Patent: Apr. 7, 2026

(54) FinFET WITH GATE EXTENSION

(71) Applicant: NXP B.V., Eindhoven (NL)

(72) Inventors: Viet Thanh Dinh, Leuven (BE);
Asanga H Perera, West Lake Hills, TX
(US); Arjan Mels, Wijchen (NL)

(73) Assignee: NXP B.V., Eindhoven (NL)

( * ) Notice: Subject to any disclaimer, the term of this
patent is extended or adjusted under 35
U.S.C. 154(b) by 652 days.

(21) Appl. No.: 17/810,846

(22) Filed: Jul. 6, 2022

(65) Prior Publication Data

US 2024/0014324 A1    Jan. 11, 2024

(51) Int. Cl.
H10D 30/01    (2025.01)
H10D 30/62    (2025.01)
H10D 84/01    (2025.01)
H10D 84/03    (2025.01)
H10D 84/83    (2025.01)
H10D 86/01    (2025.01)

(52) U.S. Cl.
CPC ..... H10D 30/6217 (2025.01); H10D 30/0241
(2025.01); H10D 84/0158 (2025.01); **H10D
84/038 (2025.01); H10D 84/834** (2025.01);
H10D 86/011 (2025.01)

(58) Field of Classification Search
CPC .......... H10D 30/6217; H10D 30/0241; H10D
84/0158; H10D 84/038; H10D 84/834;
H10D 86/011; H10D 30/6215; H10D
30/501–509; H10D 30/019; H10D
30/0191–0194; H10D 84/8311; H10D
84/8312; H10D 84/83125; H10D
84/83135; H10D 84/83138; H10D 84/8314; H10D 84/8316; H10D
84/832–833; H10D 84/835; H10D
84/836; H10D 84/837–839; H10D 84/01;
H10D 30/0281–0289; H10D 30/65–659;
H10D 30/01
See application file for complete search history.

(56) References Cited

U.S. PATENT DOCUMENTS 9,515,644 B2    12/2016  Dinh et al.
10,014,398 B2    7/2018  Donkers et al.
(Continued)

OTHER PUBLICATIONS

Deng, Yu et al; "A Novel High-k LDMOS with Triangular Trench
Field Plate"; Int'l Conf. on Electron Devices and Solid-State
Circuits; IEEE; (2019).
(Continued)

*Primary Examiner* — Matthew C Landau
*Assistant Examiner* — David W Ward

(57)    ABSTRACT

A semiconductor device and methods of forming the same
include a semiconductive fin protruding vertically from a
body region and extending along a first direction, an insu-
lator material above the body region and surrounding a
lower portion of the fin, and a gap region between first and
second ends of the semiconductive fin where at least a top
portion of the semiconductive fin is absent. The device
includes current terminals coupled to first and second ends
of the fin, and a gate electrode and a gate extension coupled
to the fin. The gate electrode surrounds the top portion of the
semiconductive fin and is separated from the semiconduc-
tive by a gate insulator material. The gate extension has a
first end adjacent to the gate electrode and a second end
above the body region within the gap region.

18 Claims, 8 Drawing Sheets

(56) References Cited

U.S. PATENT DOCUMENTS

| | | | | |
|---|---|---|---|---|
| 10,121,878 | B1 * | 11/2018 | Ciavatti | H10D 64/511 |
| 10,134,860 | B2 | 11/2018 | Sonsky et al. | |
| 2018/0108755 | A1 * | 4/2018 | Liu | H10D 62/159 |
| 2018/0197987 | A1 * | 7/2018 | Zhou | H10D 30/024 |
| 2019/0035929 | A1 * | 1/2019 | Syue | H01L 21/76229 |
| 2021/0135006 | A1 * | 5/2021 | Liu | H10D 30/65 |
| 2021/0376148 | A1 * | 12/2021 | Lee | H10D 62/114 |

OTHER PUBLICATIONS

Singh, J. et al; "FinFET LDMOS Technology Challenges and opportunities for Digital TV and 6GHz WiFi PA Applications"; Symposium on VLSI Technology Digest of Technical Papers; IEEE (2021).

Wei, Lin et al; "A Novel Contact Field Plate Application in Drain-Extended-MOSFET Transistors"; Proceedings fo the 29th Intl Symposium on Power Semiconductor Devices & ICs, Sapporo, JP; IEEE Explore; 3 pages (Jul. 24, 2017).

Lijuan Wu et al.: " Trench SOI LDMOS with vertical field plate" ; Electonics Letters Dec. 4, 2014; vol. 50 No. 25 pp. 1982-1984.

Yue Hu et al.: "Numerical investigation on L-shaped vertical field plate in high-voltage LDMOS", Elsevier, Results in Physic 15 (2019) 102547, Aug. 3, 2019, 6 pages.

* cited by examiner

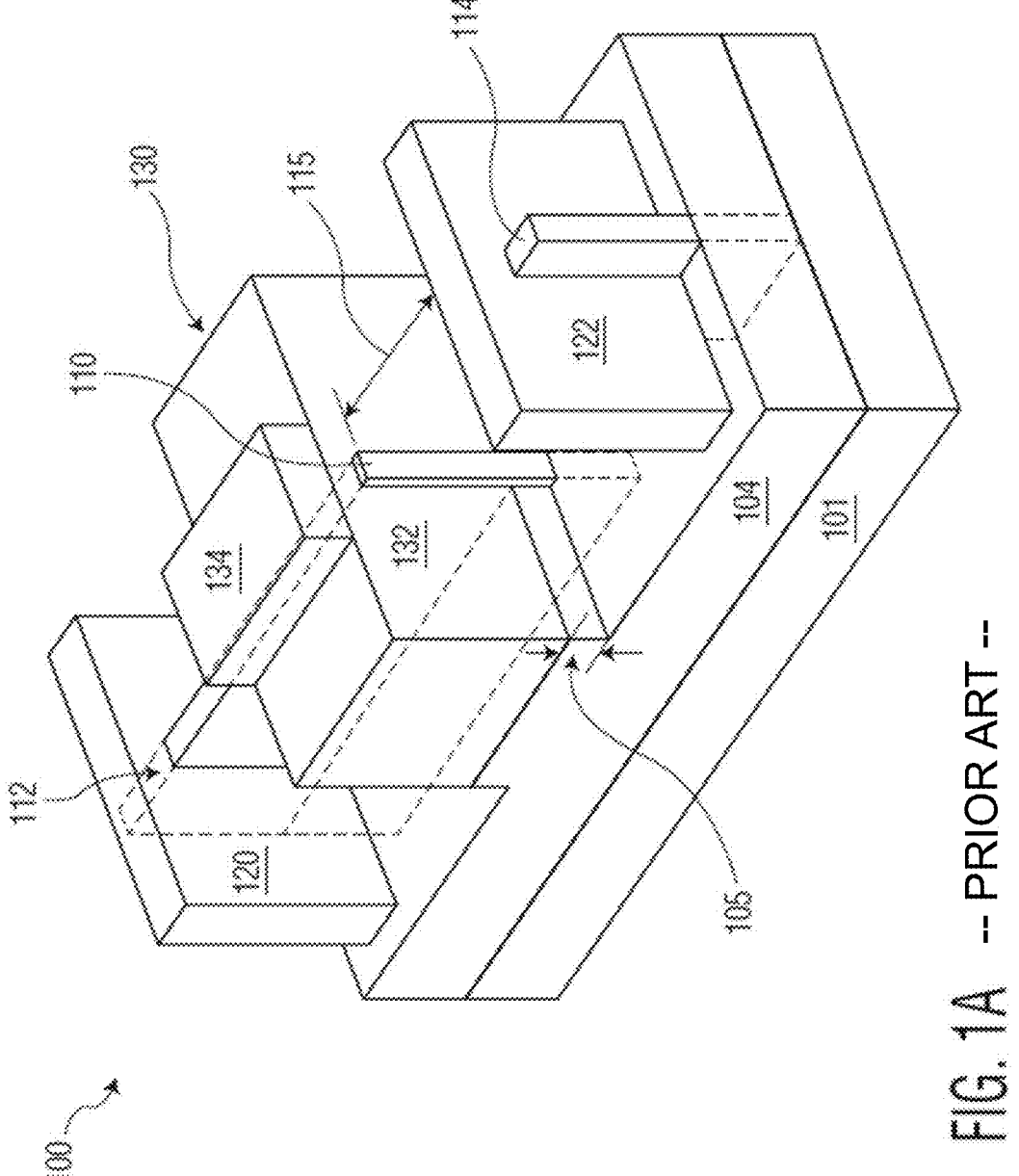
FIG. 1A  -- PRIOR ART --

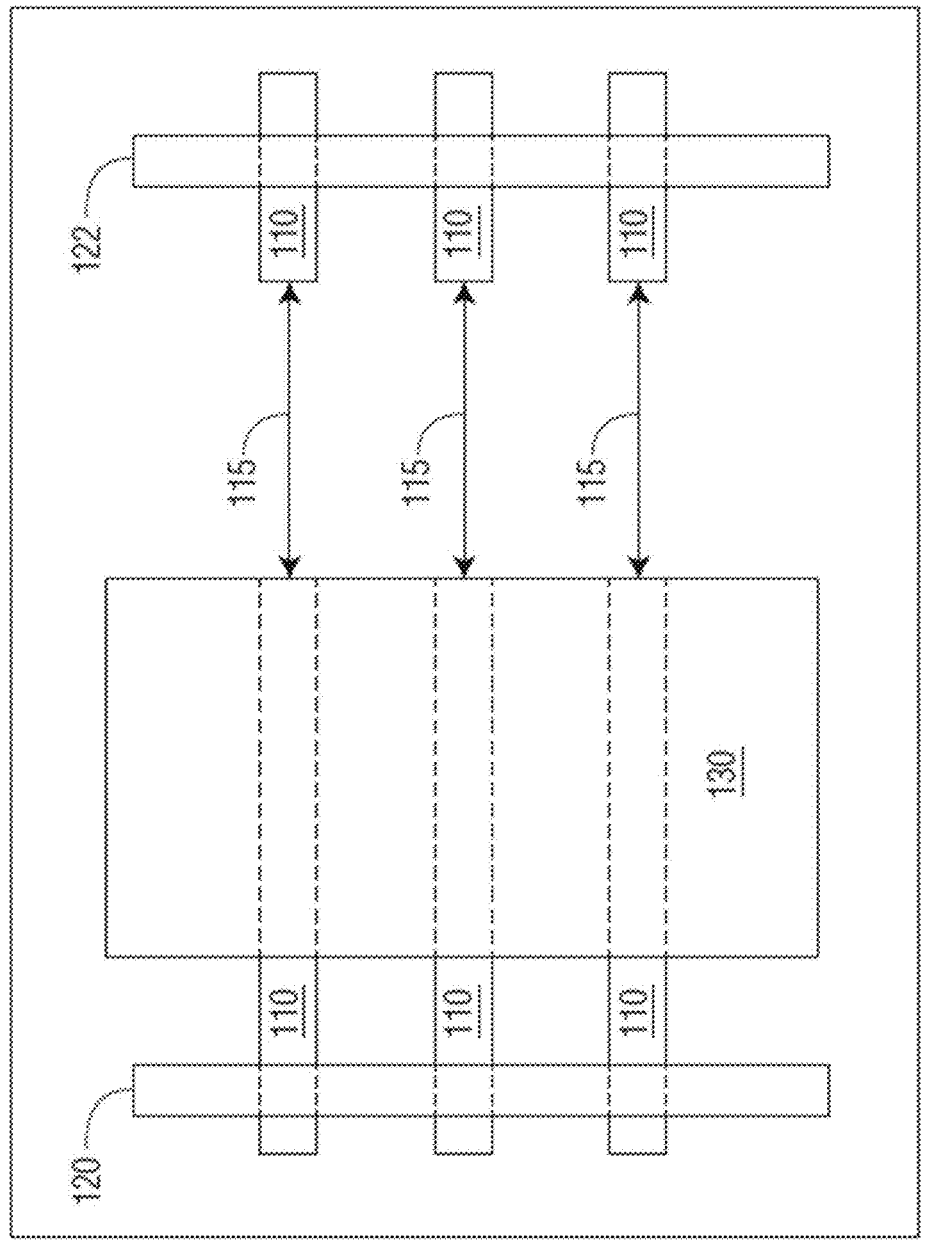
FIG. 1B   -- PRIOR ART --

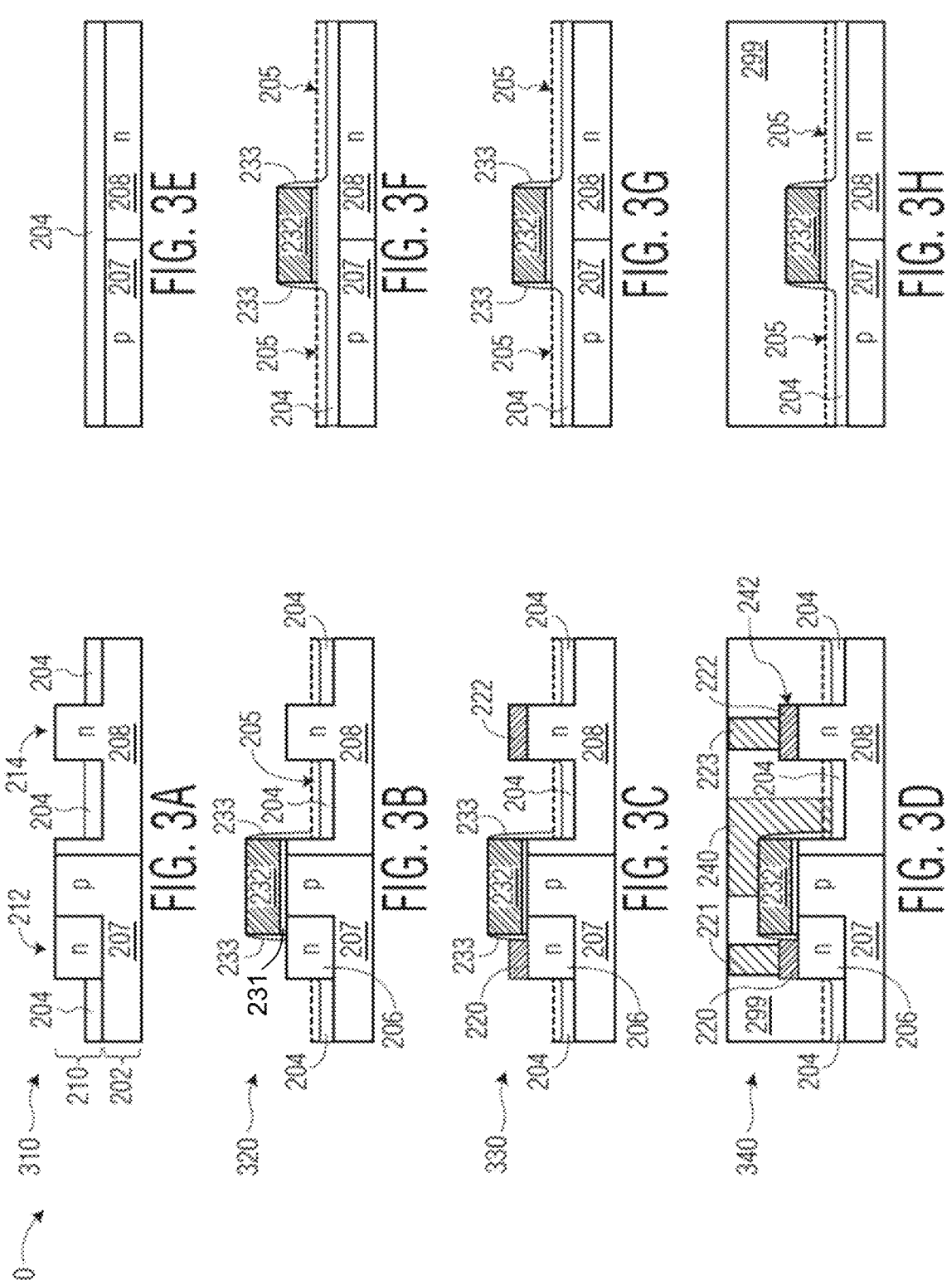

FinFET WITH GATE EXTENSION

FIELD OF THE INVENTION

Embodiments of the subject matter described herein relate to field-effect transistors and methods of fabrication of such transistors.

BACKGROUND OF THE INVENTION

Transistor-based circuits such as amplifiers are often used for analog signal processing applications including amplification of radio and microwave-frequency (RFMW) signals. In order to provide increased switching speeds, reduced device dimensions are required. However, highly-scaled devices may be more susceptible to leakage, breakdown, and incomplete switching when gated. Laterally-diffused drain implants have been used to enable high-output power silicon metal-oxide-semiconductor field effect transistors ("LD-MOS FETs") with high breakdown voltages (e.g., 10V to ~100V). In order to achieve higher current drive and lower leakage with fast switching speeds compared to conventional planar MOSFETs, three-dimensional extensions of the MOSFET architecture have been implemented, including so-called FinFETs in which active areas are formed along thin "fins" which are surrounded on two or more sides by a gate electrode. Recently, FinFETs incorporating laterally-diffused drains (LDMOS FinFETs) have been explored in attempts to further increase device performance.

SUMMARY OF THE INVENTION

In an example embodiment, a semiconductor device is provided. The device includes a body region formed from a volume of semiconductor material; at least one semiconductive fin protruding vertically from the body region with a first end and a second end; a gap region between the first and the second end of the semiconductive fin where at least a top portion of the semiconductive fin is absent; a first current terminal that is electrically coupled to the semiconductive fin at the first end of the semiconductive fin; a second current terminal that is electrically coupled to the semiconductive fin at the second end of the semiconductive fin; an electrically conductive gate electrode; and an electrically conductive gate extension.

The semiconductive fin extends along a first direction parallel to a surface of the body region from a first end to a second end of the semiconductive fin. The field insulator material is disposed directly above the body region and surrounds a lower portion of the semiconductive fin.

The gate electrode is electrically coupled to the semiconductive fin, disposed between the first end of the semiconductive fin and the gap region, surrounds the top portion of the semiconductive fin, and is separated from the semiconductive by a gate insulator material. The gate extension is electrically coupled to the semiconductive fin and has a first end adjacent to the gate electrode and a second end disposed above the body region within the gap region.

In one or more embodiments, the field insulator material has a first thickness above a first portion of the body region and the device further includes a recess in the field insulator material in the gap region in which the field insulator material has a second thickness that is less than first thickness.

In another example embodiment, a method of fabricating a semiconductor device is provided. The method includes providing a semiconductor substrate that includes a body region formed from a volume of semiconductor material; forming a semiconductive fin protruding vertically from the body region; forming an electrically insulating field insulator material disposed directly above the body region; forming a gap region between the first and the second end of the semiconductive fin where at least a top portion of the semiconductive fin is absent; forming a second current terminal that is electrically coupled to the semiconductive fin at the second end of the semiconductive fin. The fin extends along a first direction parallel to a surface of the body region from a first end to a second end of the semiconductive fin and the electrically insulating field insulator material surrounds a lower portion of the semiconductive fin.

The method further includes forming a gap region between the first and the second end of the semiconductive fin where at least a top portion of the semiconductive fin is absent; forming a gate electrode disposed between the first end of the semiconductive fin and the gap region; and forming an electrically conductive gate extension having a first end adjacent to the gate electrode and a second end disposed above the body region within the gap region. The gate electrode surrounds the top portion of the semiconductive fin and separated from the semiconductive by a gate insulator material.

In one or more embodiments, the field insulator material has a first thickness above a first portion of the body region and the method further includes forming a recess in the field insulator material in the gap region in which the field insulator material has a second thickness that is less than first thickness.

BRIEF DESCRIPTION OF THE SEVERAL VIEWS OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

FIG. 1A is perspective view of an LDMOS FinFET according to previous approaches.

FIG. 1B is an overhead plan view of the LDMOS FinFET of FIG. 1A.

FIGS. 3A-3D are cross-sectional views of the LDMOS FinFET of FIGS. 2A/B at three different stages in an example fabrication process, as viewed along the line A-B of FIG. 2B.

FIGS. 3E-3H are cross-sectional views of the LDMOS FinFET of FIG. 2A/B at the same process steps as in FIG. 3A-3D, as viewed along the line C-D of FIG. 2B.

DETAILED DESCRIPTION

Figure 2A:
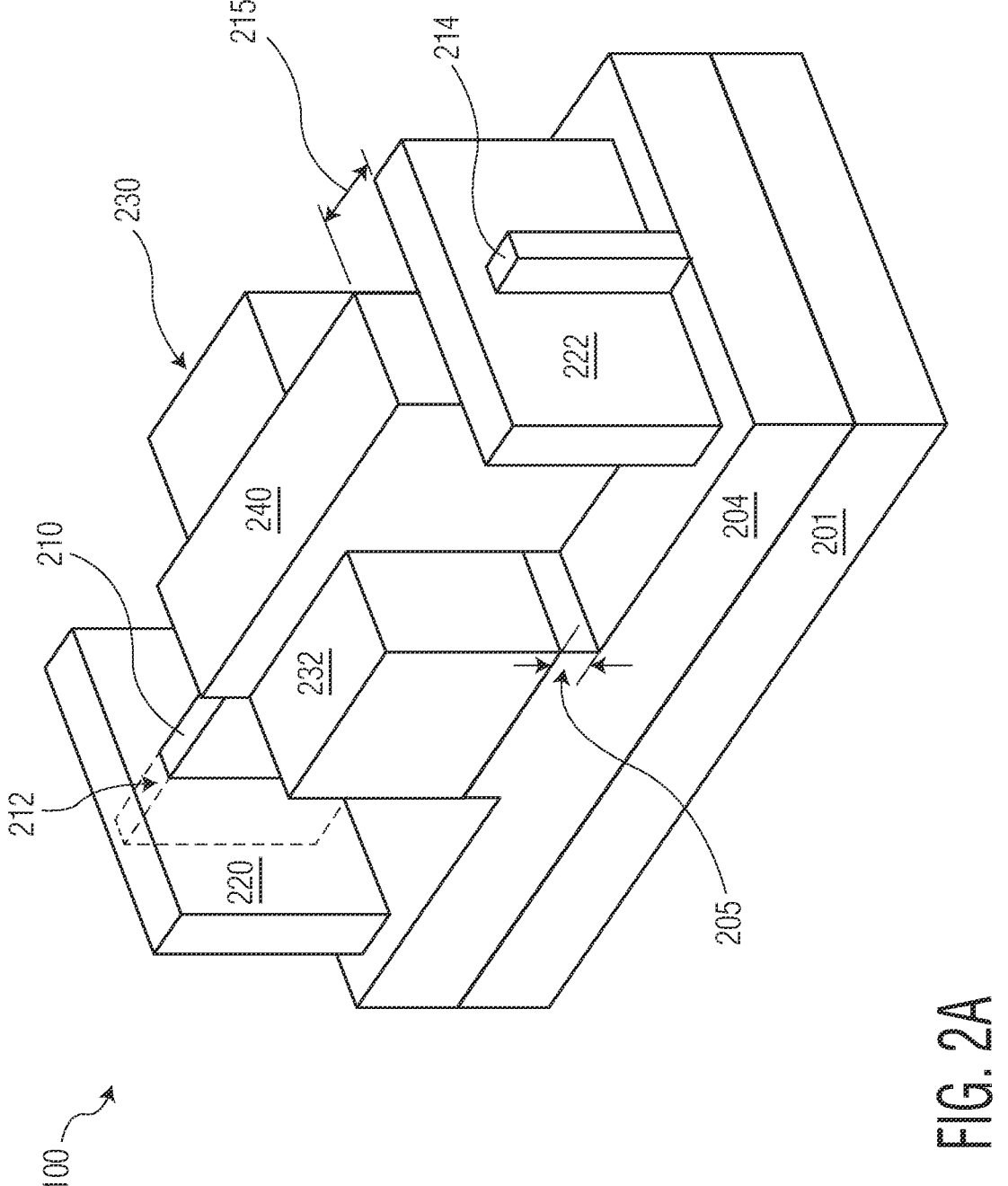
FIG. 2A is a perspective view of a LDMOS FinFET provided with a gate extension according to embodiments herein.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

Directional references such as "top," "bottom," "left," "right," "above," "below," and so forth, unless otherwise stated, are not intended to require any preferred orientation, and are made with reference to the orientation of the corresponding figure or figures for purposes of illustration.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical (including, but not limited to, direct electrical coupling, capacitive coupling, and/or inductive coupling) or in a non-electrical manner. As used herein the terms "substantial" and "substantially" mean sufficient to accomplish the stated purpose in a practical manner and that minor imperfections, if any, are not significant for the stated purpose.

It will be appreciated that the steps of various processes described herein are non-limiting examples of suitable processes according to embodiments and are for the purposes of illustration. Systems and devices according to embodiments herein may use any suitable processes including those that omit steps described herein, perform those steps and similar steps in different orders, and the like. It will also be appreciated that well-known steps or other well-known process features may be omitted for clarity.

Although combining the benefits of LDMOS and FinFET technologies is desirable, the incorporation of LDMOS technology into FinFET devices can result in undesirable degradation in the performance of such FinFETs. For example, previous LDMOS FinFETs can be susceptible to premature failure or performance degradation caused by hot carrier effects (e.g., impact ionization can damage thin gate insulators in highly-scaled devices). Accordingly, embodiments herein provide LDMOS FinFETs with additional features that can mitigate undesirable performance degradation of such devices.

FIG. 1A is perspective view of an example transistor 100, which is an LDMOS FinFET. The example transistor 100 is fabricated on a semiconductor substrate 101 having a field insulator 104. A fin 110 extends from the semiconducting material of the substrate 101 and has a first ("bottom") portion surrounded by the field insulator 104 and a second ("top") portion that extends beyond the thickness of the field insulator 104. As shown, the fin 110 extends from a first end 112 to a second end 114 of the fin. A first current terminal (a source 120 in this example) is disposed at the first end 112 and a second current terminal (a drain 122 in this example) is disposed at the second end 114. As shown the source 120 is defined by an electrode that surrounds the first end 112 of the fin 110 and the drain 122 is defined by another electrode that surrounds the fin 110 at the second end 114 of the fin 110. The example transistor 100 also has a control terminal (a gate 130) that wraps around the top portion of the fin 110. As shown the gate 130 includes a gate electrode 132 and an additional gate contact 134 above the gate electrode 132 which may be used to couple the gate electrode 132 to signal lines forming part of a larger integrated circuit incorporating the example transistor 100.

The example transistor 100 also includes a gap region 115 in the fin 110 (i.e., an area where the top portion of the fin has been etched away which is covered by the field insulator 104) that is disposed between the gate 130 and the second end 114 of the fin 110. This gap region 115 serves a similar purpose to shallow trench isolation (STI) structures in conventional planar LDMOS FETs and can be used to improve breakdown voltage characteristics over conventional LDMOS FinFET devices. As shown in FIG. 1A, the field insulator 104 has a recess 105 adjacent to the gate 130 where the field insulator 104 has a reduced thickness as indicated by a dashed line. This recess 105 may result from semiconductor processing steps used to fabricate the example transistor 100. As will be explained further below, the recess 105 present in the example transistor 100 can be exploited to provide performance advantages in embodiments while maintaining compatibility with previous FinFET device fabrication processes.

It will be understood that FIG. 1A and other figures herein are schematic illustrations that omit various details for ease of understanding. For instance, it will be understood that various portions of the fin 110 of the example transistor 100 must be appropriately doped in order for the example transistor 100 or similar devices to function. Specifically, in one or more embodiments, the source 120 and the drain 122 have a first conductivity type (i.e., n-type or p-type) and a region beneath a gate 130 forming the channel of the LDMOS FinFET will have a second, opposite conductivity type (i.e., p-type or n-type).

Although FIG. 1A depicts an LDMOS FinFET with a single fin 110, it will be understood that LDMOS FinFETs may be formed from arrays of parallel fins such as the fin 110. FIG. 1B shows an overhead view of such an arrangement in which one or multiple parallel fins 110 extended between a source 120 and a drain 122 (indicated by dashed rectangles corresponding to the footprint of source and drain contacts), with a gate 130 in between the source 120 and the drain 122 indicated by the footprint of an electrode similar to the gate electrode 132 that wraps around each fin 110 as shown in FIG. 1A. As shown, each fin 110 has a gap region 115 in between the gate 130 and the drain 122 as shown in FIG. 1A.

Although FinFETs such as the example transistor 100 have advantages over previous planar MOSFETs, such highly-scaled FinFETs can have disadvantages including reduced reliability arising from electrical breakdown-induced damage to gate insulator materials relating to hot carrier injection effects and high current densities. These and other drawbacks can be mitigated in FinFET devices provided with extended gate structures ("gate extensions") according to embodiments herein.

FIG. 2A is perspective view of an example transistor 200 provided with a gate extension according to embodiments herein. Similarly to the example transistor 100, the example transistor 200 is formed from a substrate 201 (e.g., the substrate 101) and has a semiconductive fin 210 (e.g., the fin 110) which is partially surrounded by a field insulator material 204 (e.g., the field insulator 104). Analogously to the fin 110, the fin 210 has a first end 212 and a second end 214, with a first current terminal (a source terminal 220) which makes electrical contact to the first end 212 of the fin 210 and a second current terminal (a drain terminal 222) which makes electrical contact to the second end 214 of the fin 210); and a gate 230 with a gate electrode 232 (e.g., the gate electrode 132) that wraps around a portion of the fin 210 between the first end 212 and the second end 214 of the fin 210 which forms part of the effective channel of the example transistor 200. However, in contrast to the example transistor 100, the example transistor 200 has a gate extension 240 according to embodiments herein in place of the gate contact 134 of the example transistor 100. This gate extension 240 can provide performance advantages as explained further below.

In contrast to the gate contact 134 of the example transistor 100, the gate extension 240 extends beyond the gate electrode 232 of the gate 230, with a portion that is disposed directly above the field insulator material 204 within the gap region 215 of the fin 210. It will be understood that a gate extension such as the gate extension 240 may be operated as a field plate to influence the electric field distribution, carrier concentration and current distribution between the channel of the example transistor 200 and the drain terminal 222 of the example transistor 200.

In one or more embodiments, as shown, the gate extension 240 has a portion that is disposed on top of the gate electrode 232 and directly electrically coupled to the gate electrode 232 (analogously to the gate contact 134 of the example transistor 100). It will be understood that in such embodiments, the gate extension 240 may be fabricated using existing semiconductor processes suitable for fabricating the gate contact 134 of the example transistor 100 and using any material that is also suitable for use in the gate contact 134. Accordingly, in embodiments herein, existing processes used to fabricate LDMOS FinFET devices such as the example transistor 100 may be used to fabricated LDMOS FinFET devices according to embodiments herein such as the example transistor 200.

It will be understood that in one or more other embodiments, a gate extension 240 is not directly electrically coupled to a gate electrode 232. In such embodiments, a gate extension 240 can be operated independently from the gate 230 (i.e., the gate 230 and the gate extension 240 can be biased independently of each other). In such embodiments, the gate extension 240 and a suitable gate contact (i.e., a gate contact 134) may still be fabricated using substantially similar materials and processes as those suitable for use with other LDMOS FinFET devices that do not have a gate extension 240. This can be advantageous for integrating LDMOS FinFET devices according to embodiments herein with other LDMOS FinFET devices and other semiconductor devices within complex integrated circuits.

Figure 2B:
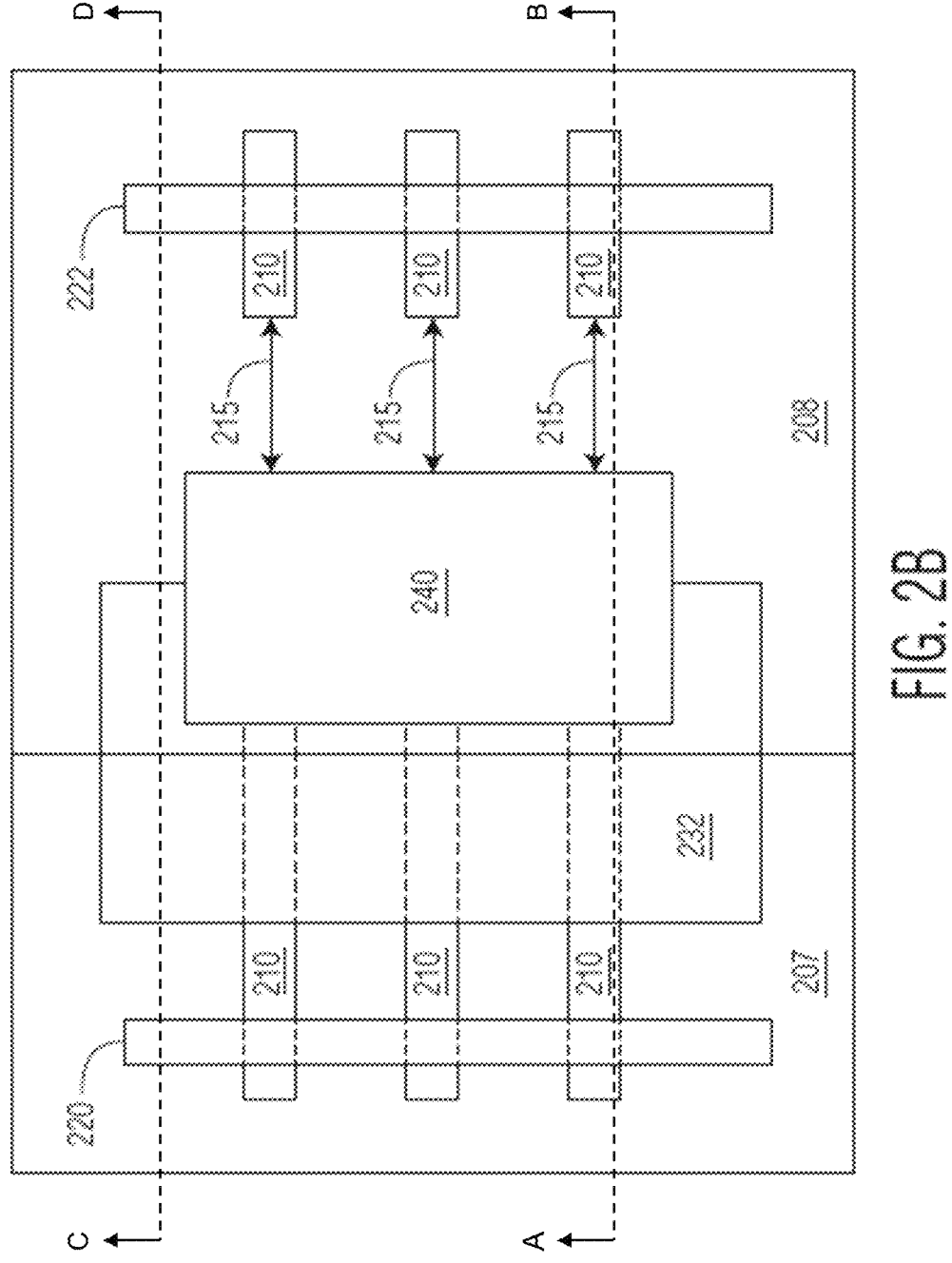
FIG. 2B is an overhead plan view of the LDMOS FinFET of FIG. 2A.

The example transistor 200 may include more than one fin 210 as illustrated by FIG. 2B. As one non-limiting example, FIG. 2B is an overhead view of the example transistor 200 having three parallel fins 210 with a common source terminal 220 formed by contacting the first end 212 of each source terminal 220 and a drain terminal 222 formed by contacting the second end 214 of each fin 210. The footprint of the gate 230 and the footprint of the gate extension 240 are also shown, along with the gap region 215 of each fin 210. In the example of FIG. 2B the footprint of a p-type well 207 and an n-type well 208 (an n-type doped well forming the source terminal 220 of each fin 210 is omitted from the illustration for clarity). It will be appreciated that the topography the example transistor 200 will differ based one whether a cross-section is viewed along a fin 210 (e.g., along the line A-B in FIG. 2B, or along an area where no fin 210 is present (e.g., along the line C-D in FIG. 2B).

It will be understood that any suitable materials may be used to form various portions of the example transistor 200 and other devices described herein. For instance, various insulating materials (i.e., the field insulator material 204, the gate insulator 231, the insulating material 233, and/or the inter-layer dielectric material 299 may be any suitable dielectric material or combinations thereof).

FIGS. 3A-3D show cross-sectional schematic views of the example transistor 200 along the line A-B of FIG. 2B at respective steps 310, 320, 330, and 340 of an example process 300 suitable for use in order to fabricate the example transistor 200 and/or related FinFET devices according to embodiments herein. FIGS. 3E-3G show cross-sectional schematic views of the example transistor 200 along the line C-D of FIG. 2B at the same respective steps 310, 320, 330, and 340 of the example process 300.

At step 310, as shown in FIG. 3A and FIG. 3E, a substrate (e.g., the substrate 201) is provided with one or more fins (e.g., the fin 110, or the fin 210) already formed that extend from a body region 202 of the substrate through the field insulator material 204. Each fin 210 having a first and second end (e.g., the first end 212 and the second end 214) and a gap region (e.g., gap region 215). As shown each fin has already been provided with a p-type well 207 and a n-type well 208 as well as an n-type region 206 (i.e., a source region) within the p-type well 207. The fin 210 may be formed by any suitable process steps. As shown the fin 210 extends upward from the body region 202 through the field insulator material 204.

At step 320 (as shown in FIG. 3B and FIG. 3F), the gate electrode 232 has been formed. A gate insulator 231 separates the gate electrode 232 from the fin 210 and may be formed by any suitable process prior to formation of the gate electrode 232. The insulating material 231 may be deposited or formed by any suitable process including sputtering, thermal oxidation, and atomic layer deposition, as non-limiting examples. Additional electrically insulating material 233 is deposited (or otherwise formed) on sidewalls of the gate electrode 232, as shown. A portion of this insulated material 233 extends into gap region 215 and into the recess 205 in the field insulator material 204 as shown. The insulating material 233 may be deposited or formed by any suitable process including sputtering, thermal oxidation, and atomic layer deposition, as non-limiting examples. The insulating material 233 may be any suitable material including but not limited to, silicon dioxide, silicon nitride, hafnium oxide, and the like. The recess 205 in the field insulator material 204 between the gate electrode 232 and the drain terminal 222 may be formed during etching processes utilized to form the gate electrode and surface cleaning processes prior to forming connection regions for the source terminal 220 and drain terminal 222.

As shown in FIG. 3F, in one or more embodiments the recess 205 in the field insulator material 204 is present along the line C-D shown in FIG. 2B (i.e., in between fins 210 in the example transistor 200). Also, in one or more embodiments, as shown in FIG. 3F, an additional recess 205 between the gate electrode 232 and the source terminal 220 is present. As above, the recess 205 may be the result of current FinFET fabrication techniques that can be exploited in embodiments herein, as explained further below.

At step 330, as shown in FIG. 3C and FIG. 3G, connection regions for the source terminal 220 and drain terminal 222 haven been formed, as shown.

At step 340, the gate extension 240 is formed with a portion that is disposed above the gate electrode 232 and another portion disposed in recess 205 in the field insulator material 204. As shown, a portion of the of the insulating material 233 forms an insulating barrier between the gate extension 240 and the exposed side-wall sidewall of the fin 210 in the gap region 215.

A source contact 221 in direct electrical contact with the source terminal 220 and a drain contact 223 in direct electrical contact with the drain terminal 222 are formed by any suitable method included but not limited to additive process such as sputtering or thermal evaporation over a lithographically patterned mask (e.g., photoresist), followed by a lift-off process, or by a subtractive process such as blanket metal deposition followed by wet chemical etching or a dry plasma etching, as non-limiting examples. An interlayer dielectric 299 is then deposited encapsulating the device. The device may be planarized as shown in FIG. 3D and FIG. 3H using a chemical-mechanical polishing or any other suitable method.

Following the steps above additional front-end and back-end processing steps may be employed to integrate a transistor (e.g., the example transistor 200) with other devices in a larger integrated circuit and/or to integrate the transistor into a chip package.

It will be appreciated that, in one or more embodiments, the steps 310, 320, 330, and 340 (or portions of one or more of these steps) may be modified in any suitable manner and performed in any suitable order. For instance, in one or more embodiments, the example transistor 200 is a silicon-based FinFET and the n-type region 206 (corresponding to the source terminal 220) is formed by epitaxial growth of n-doped silicon on top of the p-type well 207. In one more embodiments, a transistor such as the example transistor 200 is a silicon FinFET and formation of the source terminal 220 and the drain terminal 222 includes, respectively, forming a silicide material where the n-type region 206 will ultimately be coupled to the drain terminal 220, and forming a similar silicide material where a portion of the n-type well 208 will contact the source terminal 222.

It will be understood that although the gate extension 240 and similar structures (e.g., the gate extension 440 of FIG. 4. and/or the gate extension 540 of FIG. 5) may be shown in direct physical contact and/or described as electrically coupled to the gate electrode 232 in examples herein that, in one or more embodiments, the gate extension 240 is not directly coupled to the gate electrode 232 and that gate 230 and the gate extension 240 may be operated independently from each other (i.e., held at different electrical potentials). As examples, the ability to operate the gate 230 and the gate extension 240 independently can be useful in RF switching and amplification applications to achieve different performance objectives based on whether the device is being operated in a high-power regime or a low power regime and/or based on whether the device is being operated in an CON' state or an 'OFF' state. For instance, in such applications, the gate extension 240 can be biased to an electric potential that is either positive or negative (relative to a ground potential or other reference potential) to optimize the breakdown voltage threshold of the device and/or to optimize device performance to provide low CON' resistance, as non-limiting examples.

It will be appreciated that although the additional example transistor 200 and other transistors according to embodiments herein are described as a n-type transistors having n-type source and drain wells, that devices according to embodiments herein include devices in which the conductivity types are reversed. Thus, in one or more embodiments, the features of additional example transistor 200 are arranged similarly except that the conductivity types are reversed to form a p-type transistor, in which p-type wells are substituted for the n-type region 206, and the n-type well 208 and an n-type well is substituted for the p-type well 207.

Figure 4:
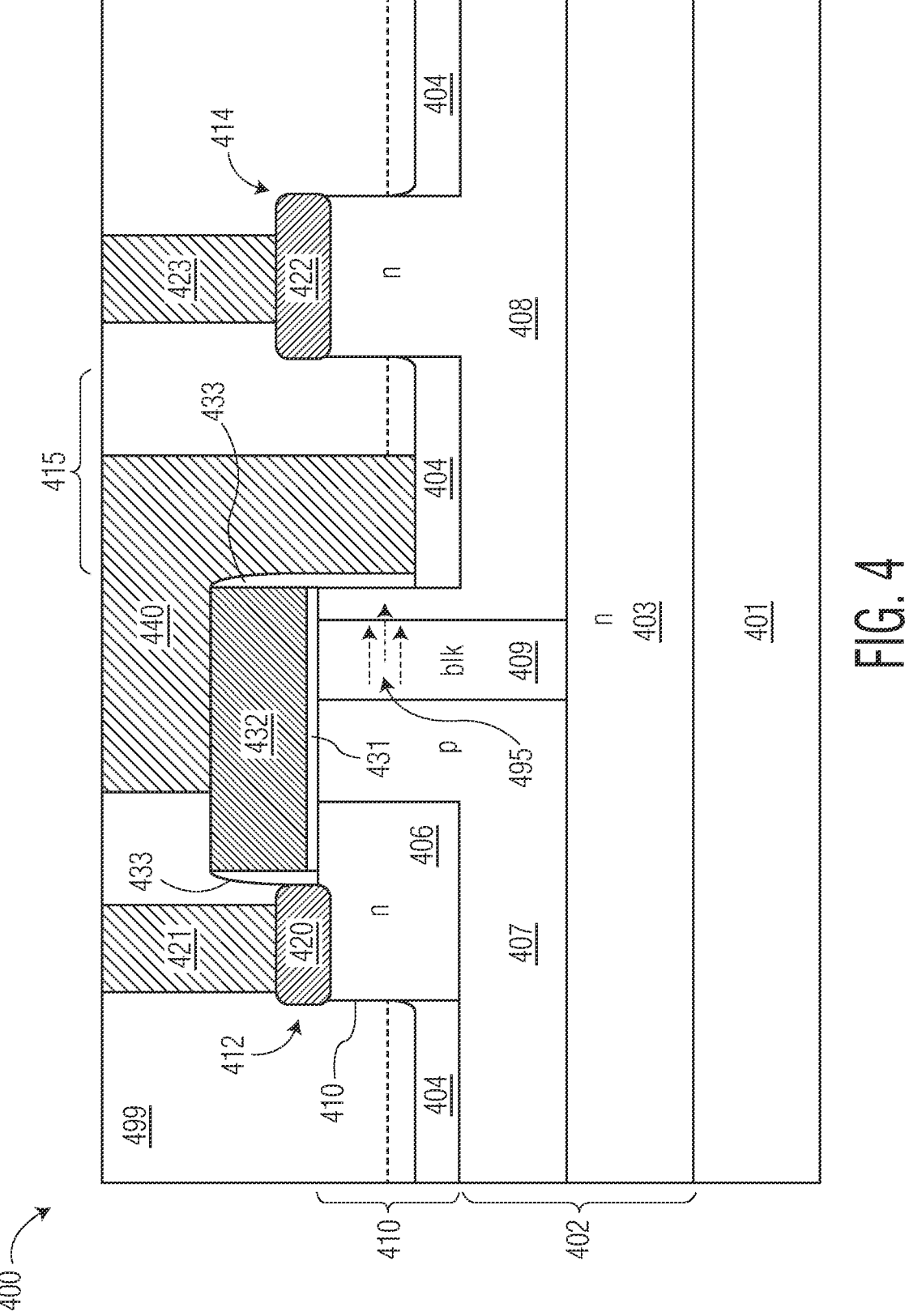
FIG. 4 is a cross-sectional view of another LDMOS FinFET related to the LDMOS FinFET of FIGS. 2A/B, in which a blocking layer is interposed between the source and drain according to embodiments.

FIG. 4 is a cross-sectional schematic view through a fin of an example transistor 400 with a gate extension 440 according to embodiments herein that is related to the example transistor 200. Analogously to the example transistor 200, the example transistor 400 has a fin 410 that extends from a body region 402 of a substrate 401 (e.g., the body region 202) through a field insulator material 404 (e.g., the field insulator material 204). The fin 410 has a first current terminal (a source terminal 420) disposed at a first end 412 of the fin 410 and a second current terminal (a drain terminal 422) disposed at a second end 414 of the fin 410. The example transistor 400 also includes a gap region where the fin 410 has been etched or is otherwise absent above the field insulator material 404, in which a recess 405 in the field insulator material 404 is present and in which a portion of a gate extension 440 (e.g., the gate extension 240) is disposed. Similarly, to the example transistor 200 the example transistor 400 has a highly-doped n-type region 406 (i.e., a source region) electrically coupled to the source terminal 420 (and a source contact 421) and a drain terminal 422 coupled to an n-type well 408 (e.g., the n-type well 208) and a drain contact 423 (e.g., the drain contact 223). The fin 410 also includes a p-type well 407 (e.g., the p-type well 207) disposed between the highly-doped n-type region 406 and the n-type well 408. However, unlike the example transistor 200, the example transistor 400 includes a blocking layer 409 beneath the gate electrode 432 in between the p-type well 407 and the n-type well 408. In one or more embodiments, as shown the p-type well 407, blocking layer 409, and n-type well 408 are separated from the rest of the substrate 401 by a deep n-type well 403 that can reduce leakage current flowing into the substrate 402 underlying the example transistor 400. The features of the example transistor 400 shown may be encapsulated within an insulating material 499 (e.g., the inter-layer dielectric 299) and planarized as shown in FIG. 4.

The blocking layer 409 may be lightly p-doped or undoped (i.e., much less heavily doped than the p-type well 407). For example, in one or more embodiments, the doping concentration of the p-type well 407 may be at least ten times greater than the doping of the blocking layer 409; in one or more other embodiments, the doping concentration of the p-type well 407 may be more than ten times greater than the doping of the blocking layer 409 and less than one hundred times greater; and in one or more other embodiments, the doping concentration of the p-type well 407 may be at least one hundred times greater than the doping of the blocking layer 409 to obtain desired operating characteristics for a particular application.

Use of a blocking layer such as the blocking layer 409 can be desirable for particular applications. For instance, high electric fields at an abrupt highly-doped p-n junction underneath a gate electrode in a highly-scaled LDMOS FinFET (e.g., the example transistor 100 or the example transistor 200) can result in damage to the gate insulator (e.g., the gate insulator 231) and/or accelerated degradation of device performance caused by hot carrier injection. Accordingly, the blocking layer 409 can be configured to act as a buffer layer between the p-type well 407 and the n-type well 408 that results in a more gradual junction and lower electric field gradients immediately beneath the gate insulator 431 (e.g., the gate insulator 231). As a result hot carriers (represented by the hot carriers 495 in FIG. 4) are produced away from the gate insulator 431 and instead encounter the much thicker field insulator material 404. As a non-limiting example, the gate insulator 431 may be 35-65 Angstroms while the effective thickness of the field insulator material 404 with respect to the hot carriers 495 may be orders of magnitude greater (e.g., 3000-5000 Angstroms). As a result, the example transistor 400 may have increased robustness with respect to avalanche-induced failure compared to the example transistor 200.

It will be appreciated that although the additional example transistor 400 is described as an n-type transistor having n-type source and drain wells, that one or more embodiments, the features of additional example transistor 400 are arranged similarly except that conductivity types are reversed. For instance, in one more embodiments p-type wells are substituted for the highly-doped n-type region 406, and the n-type well 408 and an n-type well is substituted for the p-type well 407. In one or more such embodiments, the blocking layer 409 is lightly n-doped or undoped and a p-type well is substituted for the deep n-type well 403.

Figure 5:
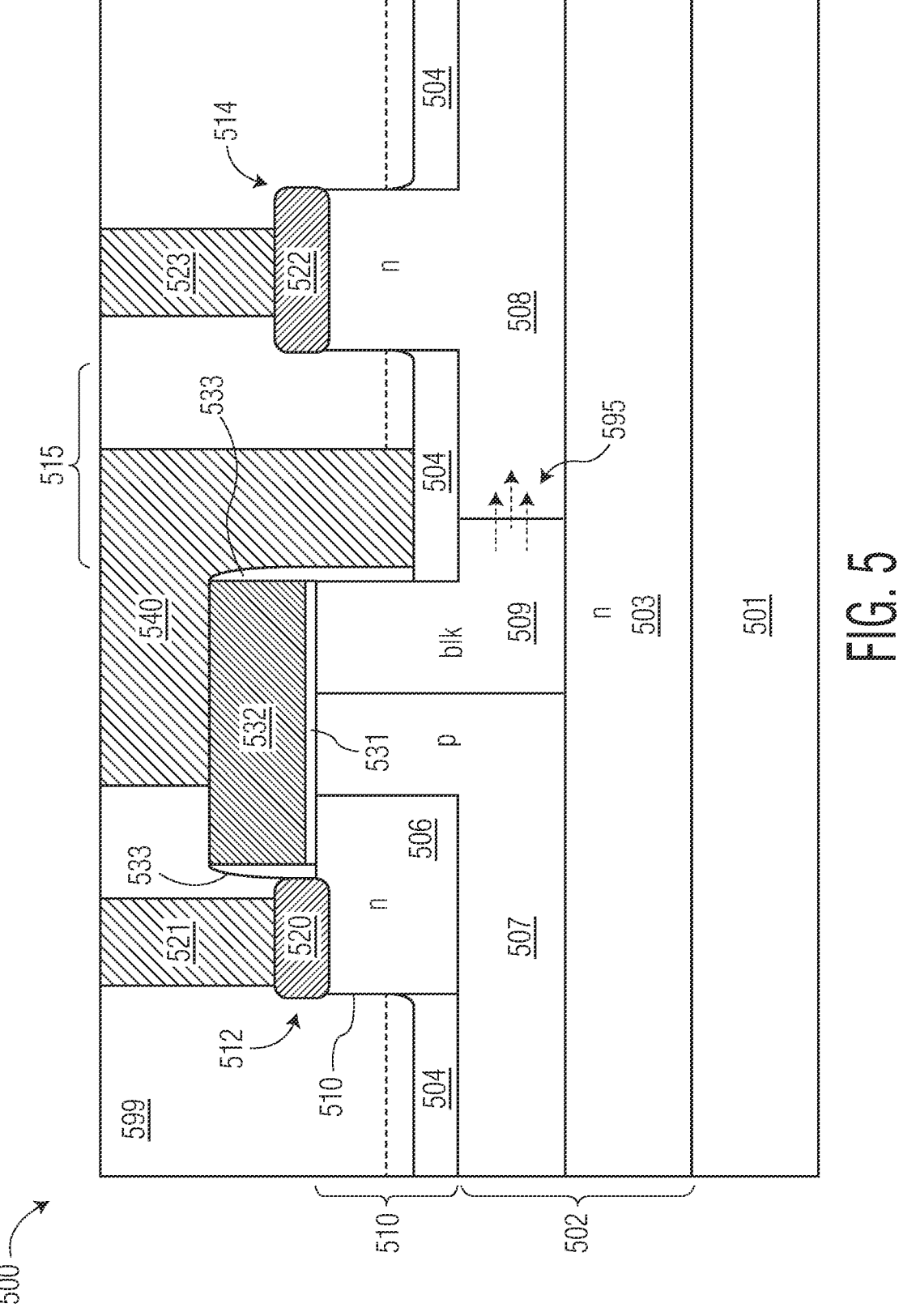
FIG. 5 is a cross-sectional view of another LDMOS FinFET related to the LDMOS FinFET of FIG. 4, with an alternative blocking layer configuration according to embodiments herein.

FIG. 5 is a cross-sectional schematic view through a fin of an additional example transistor 500 with a gate extension 540 according to embodiments herein that is related to the example transistor 400. Analogously to the example transistor 500, the example transistor 500 has a fin 510 that extends from a body region 502 of a substrate 501 (e.g., the body region 402) through a field insulator material 504 (e.g., the field insulator material 404). The fin 510 has a first current terminal (a source terminal 520) disposed at a first end 512 of the fin 510 and a second current terminal (a drain terminal 522) disposed at a second end 514 of the fin 510. The example transistor 500 also includes a gap region 515 (e.g., the gap region 415), in which a recess 505 (e.g., the recess 405) in the field insulator material 504 is present and in which a portion of a gate extension 540 (e.g., the gate extension 440) is disposed.

Similarly to the example transistor 400, the example transistor 500 has an n-type region 506 (e.g., the highly-doped n-type region 406) electrically coupled to the source terminal 520 (and a source contact 521 coupled to the source terminal 520) and a drain terminal 522 coupled to an n-type well 508 (e.g., the n-type well 408) and a drain contact 523 (e.g., the drain contact 223) coupled to the drain terminal 522. The fin 510 also includes a p-type well 507 (e.g., the p-type well 407) disposed between the highly-doped n-type region 506 and the n-type well 508, and a blocking layer 509. The features of the example transistor 500 may be encapsulated within an insulating material 599 (e.g., the insulating material 499) and planarized as shown in FIG. 5. As above, in one or more embodiments, a transistor such as the additional example transistor 500, includes a deep n-type well such as the n-type well 503 that can reduce leakage current flowing into the substrate 501 underlying the example transistor 500.

Generally, the blocking layer 509 is configured similarly to the blocking layer 409 and similarly serves as a buffer region between the p-type well 507 and the n-type well 508. For example, the doping concentration of the blocking layer 509 is significantly lower than the doping of the neighboring p-type well 508. However, in the example transistor 500, the blocking layer 509 extends past the overhang the gate electrode 532 and the junction between the blocking layer 509 and the n-type well 508 (i.e., the drain well of the example transistor 500) is underneath the gate extension 540 rather than the gate electrode 532, in contrast to the positions of the junction between the blocking layer 409 and the n-type well 408 in the example transistor 400 as shown in FIG. 4.

As a result, the additional example transistor 500 may be even less susceptible to damage to the gate insulator 531 arising from hot carrier injection as hot carriers 595 now predominantly occur closer to the bulk of the substrate 501 (instead of in the vicinity of gate insulator 531) and beneath the recess 505 in the field insulator material 504, which can be significantly thicker than the gate insulator 531, even when accounting for the reduced thickness of the field insulator material 504 within the recess 505. This device architecture can enable improved FinFETs with laterally-diffused drains breakdown voltage and greater robustness for high voltage applications that require drain-to-source voltages well above 10V.

It will be appreciated that although the additional example transistor 500 is described as an n-type transistor having n-type source and drain wells, that one or more embodiments, the features of additional example transistor 500 are arranged similarly except that conductivity types are reversed. For instance, in one more embodiments p-type wells are substituted for the n-type wells 506, 508 and an n-type well is substituted for the p-type well 507. In one or more such embodiments, the blocking layer 509 is lightly n-doped or undoped and a p-type well is substituted for the deep n-type well 503.

Figure 6:
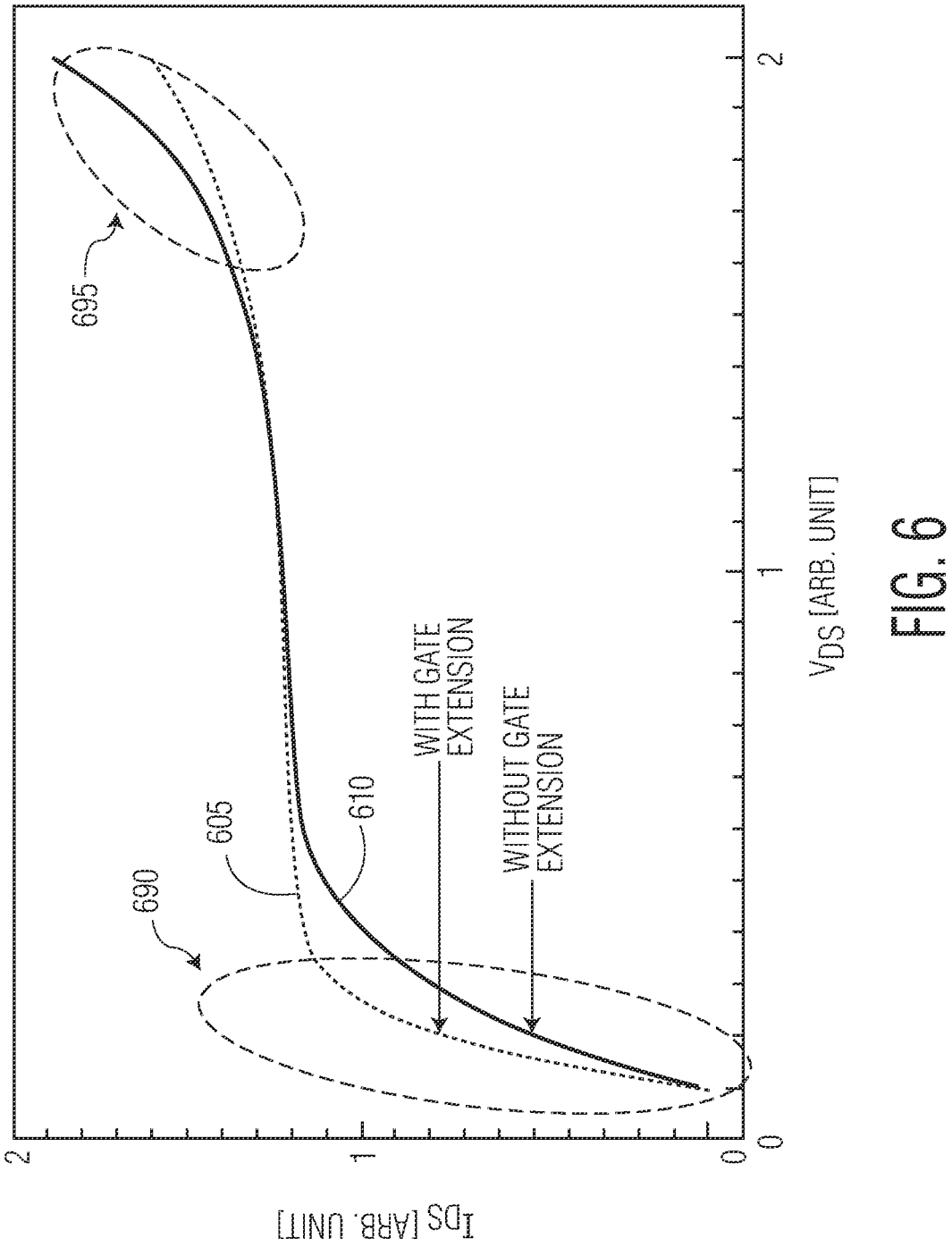
FIG. 6 is a graph comparing the simulated electrical performance of a device provided with a gate extension according to embodiments herein with the simulated electrical performance of a device without such a gate extension.

FIG. 6 is a chart showing the results of simulations comparing the current-voltage transfer characteristics of two modeled transistors. The curve 605 represents for the result for a transistor similar to the example transistor 100 which has a gap region (e.g., gap region 105) but does not have a gate extension (e.g., a gate extension 240, 440, 340). Meanwhile, the curve 650 is representative of a device related to the example transistor 200 that has a gate extension (e.g., the gate extension 240). It will be appreciated that the curve 610 corresponding to a device according to embodiments herein displays higher drain-to-source current, IDS, for a given applied voltage difference between drain and source, $V_{DS}$ in the linear regime (see the region 690 of FIG. 6). Meanwhile, in the breakdown regime (see the region 695 of FIG. 6), IDS increases more rapidly with increasing $V_{DS}$ for the conventional device (curve 605) compared to the device with an extension (curve 610).

Features of embodiments may be understood by way of one or more of the following examples:

Example 1: a device or method including a body region formed from a volume of semiconductor material; at least one semiconductive fin protruding vertically from the body region; a gap region between the first and the second end of the semiconductive fin where at least a top portion of the semiconductive fin is absent; a first current terminal that is electrically coupled to the semiconductive fin at the first end of the semiconductive fin; a second current terminal that is electrically coupled to the semiconductive fin at the second end of the semiconductive fin; an electrically conductive gate electrode; and an electrically conductive gate extension.

In Example 1, the semiconductive fin extends along a first direction parallel to a surface of the body region from a first end to a second end of the semiconductive fin. The field insulator material is disposed directly above the body region and surrounds a lower portion of the semiconductive fin.

In Example 1, the gate electrode is electrically coupled to the semiconductive fin, disposed between the first end of the semiconductive fin and the gap region, surrounds the top portion of the semiconductive fin, and is separated from the semiconductive by a gate insulator material. The gate extension is electrically coupled to the semiconductive fin and has a first end adjacent to the gate electrode and a second end disposed above the body region within the gap region.

Example 2: The device or method of Example 1, where the field insulator material has a first thickness above a first portion of the body region and further including a recess in the field insulator material in the gap region in which the field insulator material has a second thickness that is less than first thickness. The gate extension is separated from the volume of semiconducting material by the second thickness of the field insulator material in the gap region Example 3: The device or method of either Example 1 or Example 2 that further includes a first doped region having a first conductivity at the first end of the semiconductive fin and a second doped region having a second conductivity type opposite the first conductivity disposed beneath the gate electrode at a location between the first doped region and the second end of the semiconductive fin; and a third doped region having the first conductivity type at the second end of the semiconductive fin. The first doped region, the second doped region, and the third doped region are configured such that a conductive path from the first current terminal to the second current terminal is formed when a suitable bias voltage is applied to the gate electrode.

Example 4: The device or method of any of Examples 1-3, further including a drift region disposed beneath the gate electrode at a location between the second doped region and the third doped region. The drift region has the second conductivity type and a dopant concentration that is lower than a dopant concentration of the second doped region and lower than a dopant concentration of the third doped region.

Example 5: The device or method of Example 4, in which the drift region contacts the second doped region and the third doped region beneath the gate electrode.

Example 6: The device or method of Example 4, where the drift region contacts the second doped region beneath the gate electrode and the drift region contacts the third doped region beneath the gate extension in the gap region.

Example 7: The device or method of any of Examples 1-6, where the gate extension is electrically coupled to the gate electrode such that an electrical potential of the gate extension is the same as an electrical potential of the gate electrode when a bias voltage is applied to the gate electrode.

Example 8: The device or method of any of Examples 1-6, where the gate extension and the gate electrode are jointly configured and arranged to allow the gate electrode to be biased to a first electrical potential and to allow the gate extension to be biased to a second electrical potential that is different from the first electrical potential.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent example functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one example arrangement of elements, additional intervening elements, devices, features, or components may be present in one or more embodiments of the depicted subject matter.

What is claimed is:

1. A semiconductor device comprising:
a body region formed from a volume of semiconductor material;
a semiconductive fin protruding vertically from the body region and extending along a first direction parallel to a surface of the body region from a first end to a second end of the semiconductive fin, wherein the fin forms part of an effective channel of the semiconductor device;
electrically insulating field insulator material disposed directly above the body region and surrounding a lower portion of the semiconductive fin;
a gap region between the first and the second end of the semiconductive fin where at least a top portion of the semiconductive fin is absent;
a first current terminal that is electrically coupled to the semiconductive fin at the first end of the semiconductive fin;
a second current terminal that is electrically coupled to the semiconductive fin at the second end of the semiconductive fin;
a gate electrode that is electrically coupled to the semiconductive fin and disposed between the first end of the semiconductive fin and the gap region, the gate electrode surrounding the top portion of the semiconductive fin and separated from the semiconductive fin by a gate insulator material;
additional electrically insulating material on a sidewall of the gate electrode and extending continuously from the sidewall of the gate electrode onto and along a sidewall of the semiconductive fin to contact the field insulator material within the gap region; and
an electrically conductive gate extension that is separately formed from the gate electrode and is electrically coupled to the semiconductive fin, and wherein the gate extension has a first portion disposed on top of and directly electrically coupled to the gate electrode and a second portion that extends beyond the gate electrode into the gap region to contact the field insulator material within the gap region, and wherein the additional electrically insulating material is present between the sidewall of the gate electrode and the second portion of the gate extension, and the additional electrically insulating material forms an insulating barrier between the second portion of the gate extension and the sidewall of the semiconductive fin.

2. The semiconductor device of claim 1, wherein the semiconductive fin comprises:
a first doped region having a first conductivity at the first end of the semiconductive fin;
a second doped region having a second conductivity type opposite the first conductivity disposed beneath the gate electrode at a location between the first doped region and the second end of the semiconductive fin; and
a third doped region having the first conductivity type at the second end of the semiconductive fin; and wherein the first doped region, the second doped region, and the third doped region are configured such that a conductive path from the first current terminal to the second current terminal is formed when a suitable bias voltage is applied to the gate electrode.

3. The semiconductor device of claim 2, wherein the field insulator material has a first thickness above a first portion of the body region;
wherein the semiconductor device further comprises a recess in the field insulator material in the gap region in which the field insulator material has a second thickness that is less than first thickness; and
wherein the gate extension is separated from the volume of semiconductor material by the second thickness of the field insulator material in the gap region.

4. The semiconductor device of claim 2, further comprising:
a drift region disposed beneath the gate electrode at a location between the second doped region and the third doped region;
wherein the drift region has the second conductivity type and a dopant concentration that is lower than a dopant concentration of the second doped region and lower than a dopant concentration of the third doped region.

5. The semiconductor device of claim 4,
wherein the drift region contacts the second doped region and the third doped region beneath the gate electrode.

6. The semiconductor device of claim 4, wherein the field insulator material has a first thickness above a first portion of the body region;
wherein the semiconductor device further comprises a recess in the field insulator material in the gap region in which the field insulator material has a second thickness that is less than first thickness; and
wherein the gate extension is separated from the volume of semiconductor material by the second thickness of the field insulator material in the gap region.

7. The semiconductor device of claim 4,
wherein the drift region contacts the second doped region beneath the gate electrode; and
wherein the drift region contacts the third doped region beneath the gate extension in the gap region.

8. The semiconductor device of claim 7, wherein the field insulator material has a first thickness above a first portion of the body region;
wherein the semiconductor device further comprises a recess in the field insulator material in the gap region in which the field insulator material has a second thickness that is less than first thickness; and
wherein the gate extension is separated from the volume of semiconductor material by the second thickness of the field insulator in the gap region.

9. The semiconductor device of claim 2, wherein the gate extension is electrically coupled to the gate electrode such that an electrical potential of the gate extension is the same as an electrical potential of the gate electrode when a bias voltage is applied to the gate electrode.

10. A semiconductor device comprising:
a body region formed from a volume of semiconductor material;
a semiconductive fin protruding vertically from the body region and extending along a first direction parallel to a surface of the body region from a first end to a second end of the semiconductive fin;
a gap region between the first and the second end of the semiconductive fin where at least a top portion of the semiconductive fin is absent;

electrically insulating field insulator material disposed directly above the body region and surrounding a lower portion of the semiconductive fin, the field insulator material having a first thickness above a first portion of the body region;

a first current terminal that is electrically coupled to the semiconductive fin at the first end of the semiconductive fin;

a second current terminal that is electrically coupled to the semiconductive fin at the second end of the semiconductive fin;

a gate electrode that is electrically coupled to the semiconductive fin and disposed between the first end of the semiconductive fin and the gap region, the gate electrode surrounding the top portion of the semiconductive fin and separated from the semiconductive fin by a gate insulator material;

a recess in the field insulator material in the gap region in which the field insulator material has a second thickness that is less than first thickness;

additional electrically insulating material on a sidewall of the gate electrode and extending continuously from the sidewall of the gate electrode onto and along of a sidewall of the semiconductive fin to contact the field insulator material within the gap region; and an electrically conductive gate extension that is separately formed from the gate electrode and is electrically coupled to the semiconductive fin, and wherein the gate extension has a first portion disposed on top of and directly electrically coupled to the gate electrode and a second portion that extends beyond the gate electrode into the gap region to contact the recess in the field insulator material, wherein the second end of the gate extension is separated from the body region by a distance corresponding to the second thickness of the field insulator material, and wherein the additional electrically insulating material is present between the sidewall of the gate electrode and the second portion of the gate extension, and the additional electrically insulating material forms an insulating barrier between the second portion of the gate extension and the sidewall of the semiconductive fin.

11. A method of fabricating a semiconductor device, the method comprising:

providing a semiconductor substrate that includes a body region formed from a volume of semiconductor material;

forming a semiconductive fin protruding vertically from the body region and extending along a first direction parallel to a surface of the body region from a first end to a second end of the semiconductive fin;

forming an electrically insulating field insulator material disposed directly above the body region that surrounds a lower portion of the semiconductive fin;

forming a gap region between the first and the second end of the semiconductive fin where at least a top portion of the semiconductive fin is absent;

forming a first current terminal that is electrically coupled to the semiconductive fin at the first end of the semiconductive fin;

forming a second current terminal that is electrically coupled to the semiconductive fin at the second end of the semiconductive fin;

forming a gate electrode disposed between the first end of the semiconductive fin and the gap region, the gate electrode surrounding the top portion of the semiconductive fin and separated from the semiconductive fin by a gate insulator material;

forming additional electrically insulating material on a sidewall of the gate electrode and extending continuously from the sidewall of the gate electrode onto and along a sidewall of the semiconductive fin to contact the field insulator material within the gap region; and forming an electrically conductive gate extension having a first portion disposed on top of and directly electrically coupled to the gate electrode and a second portion that extends beyond the gate electrode into the gap region to contact the field insulator material within the gap region, and wherein the additional electrically insulating material is present between the sidewall of the gate electrode and the second portion of the gate extension, and the additional electrically insulating material forms an insulating barrier between the second portion of the gate extension and the sidewall of the semiconductive fin.

12. The method of claim 11, wherein the forming of the semiconductive fin comprises:

forming a first doped region having a first conductivity type at the first end of the semiconductive fin;

forming a second doped region having a second conductivity type opposite the first conductivity type disposed beneath the gate electrode at a location between the first doped region and the second end of the semiconductive fin; and forming a third doped region having the first conductivity type at the second end of the semiconductive fin; and wherein the first doped region, the second doped region, and the third doped region are configured such that a conductive path from the first current terminal to the second current terminal is formed when a suitable bias voltage is applied to the gate electrode.

13. The method of claim 12, wherein the field insulator material has a first thickness above a first portion of the body region;

wherein the method further comprises forming a recess in the field insulator material in the gap region in which the field insulator material has a second thickness that is less than first thickness; and wherein the gate extension is separated from the volume of semiconductor material by the second thickness of the field insulator material in the gap region.

14. The method of claim 12, wherein the method further comprises:

forming a drift region disposed beneath the gate electrode at a location between the second doped region and the third doped region; and wherein the drift region has the second conductivity type and a dopant concentration that is lower than a dopant concentration of the second doped region and lower than a dopant concentration of the third doped region.

15. The method of claim 14, wherein the drift region contacts the second doped region and the third doped region beneath the gate electrode.

16. The method of claim 14, wherein the field insulator material has a first thickness above a first portion of the body region;

wherein the semiconductor device further comprises a recess in the field insulator material in the gap region in which the field insulator material has a second thickness that is less than first thickness; and wherein the gate extension is separated from the volume of semiconductor material by the second thickness of the field insulator material in the gap region.

17. The method of claim 14, wherein the drift region contacts the second doped region beneath the gate electrode; and wherein the drift region contacts the third doped region beneath the gate extension in the gap region.

18. The method of claim 17, wherein the field insulator material has a first thickness;

wherein the method further comprises forming a recess in the field insulator material in the gap region in which the field insulator material has a second thickness that is less than first thickness; and wherein the gate extension is separated from the volume of semiconductor material by the second thickness of the field insulator material in the gap region.

\* \* \* \* \*